(12) United States Patent
Sutardja et al.

(10) Patent No.: US 7,939,445 B1
(45) Date of Patent: May 10, 2011

(54) HIGH DENSITY VIA AND METAL INTERCONNECT STRUCTURES, AND METHODS OF FORMING THE SAME

(75) Inventors: Pantas Sutardja, Los Gatos, CA (US); Albert Wu, Palo Alto, CA (US); Winston Lee, Palo Alto, CA (US); Peter Lee, Fremont, CA (US); Chien-Chuan Wei, Sunnyvale, CA (US); Runzi Chang, San Jose, CA (US)

(73) Assignee: Marvell International Ltd., Hamilton (BM)

( * ) Notice: Subject to any disclaimer, the term of this patent is extended or adjusted under 35 U.S.C. 154(b) by 461 days.

(21) Appl. No.: 12/049,229

(22) Filed: Mar. 14, 2008

Related U.S. Application Data

(60) Provisional application No. 60/895,296, filed on Mar. 16, 2007.

(51) Int. Cl.
*H01L 21/4763* (2006.01)
(52) U.S. Cl. .. 438/618; 438/669; 438/734; 257/E21.575
(58) Field of Classification Search .................. 438/618, 438/669, 734; 257/E21.575
See application file for complete search history.

(56) References Cited

U.S. PATENT DOCUMENTS

| | | | | |
|---|---|---|---|---|
| 6,278,189 | B1 * | 8/2001 | Jeng et al. | 257/774 |
| 2002/0053686 | A1 * | 5/2002 | Suh | 257/211 |
| 2006/0244094 | A1 * | 11/2006 | Kajimoto et al. | 257/508 |
| 2007/0210453 | A1 * | 9/2007 | Large et al. | 257/758 |

OTHER PUBLICATIONS

Price et al., "Damascene copper interconnects with polymer ILDs," Thin Solid Films, 308-309, 1997, pp. 523-528.*

* cited by examiner

*Primary Examiner* — Asok K Sarkar
*Assistant Examiner* — Julia Slutsker

(57) ABSTRACT

Methods and structures for interconnects in semiconductor devices are described. A method of forming a mask pattern for a metal layer in an interconnect can include searching a layout for a metal feature with a predetermined size and an interconnect layer aligned thereto, removing the metal feature from the layout to form a modified layout, and reforming the mask pattern using the modified layout. The metal interconnect may include a first pattern of metal lines, each having a minimum feature size in a layout view in no more than one dimension; a dielectric layer on or over the first pattern of metal lines, having a substantially planar horizontal upper surface; and vias or contacts in the dielectric layer, the vias or contacts contacting a top surface of the first pattern of metal lines and a top surface of silicon structures, vias, or contacts below the first pattern of metal lines.

21 Claims, 12 Drawing Sheets

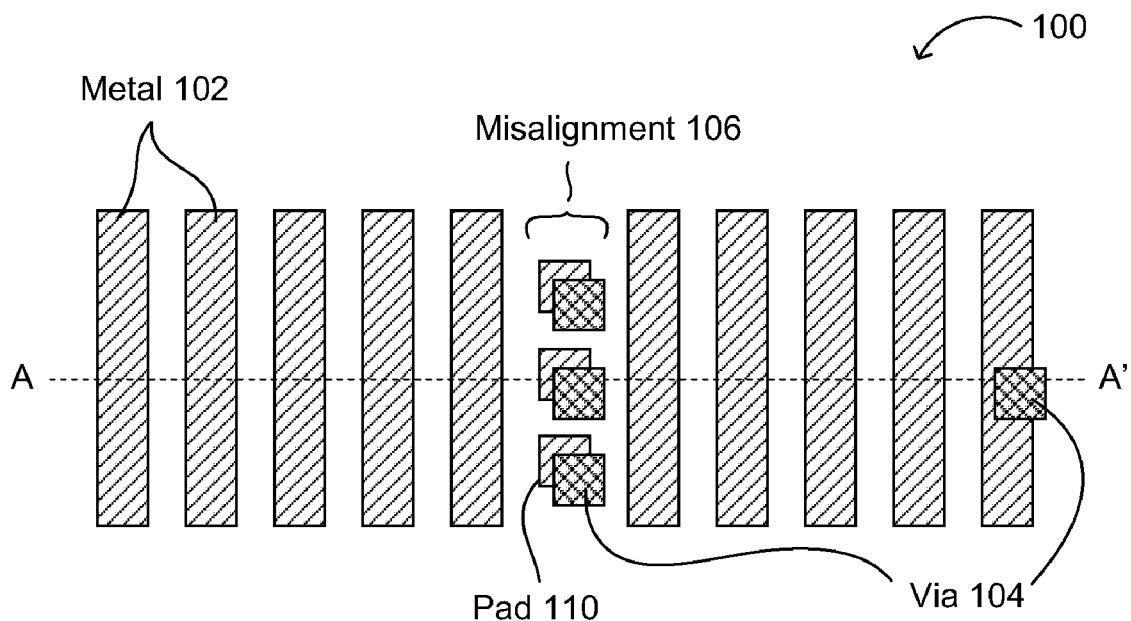
FIG. 1 (conventional)
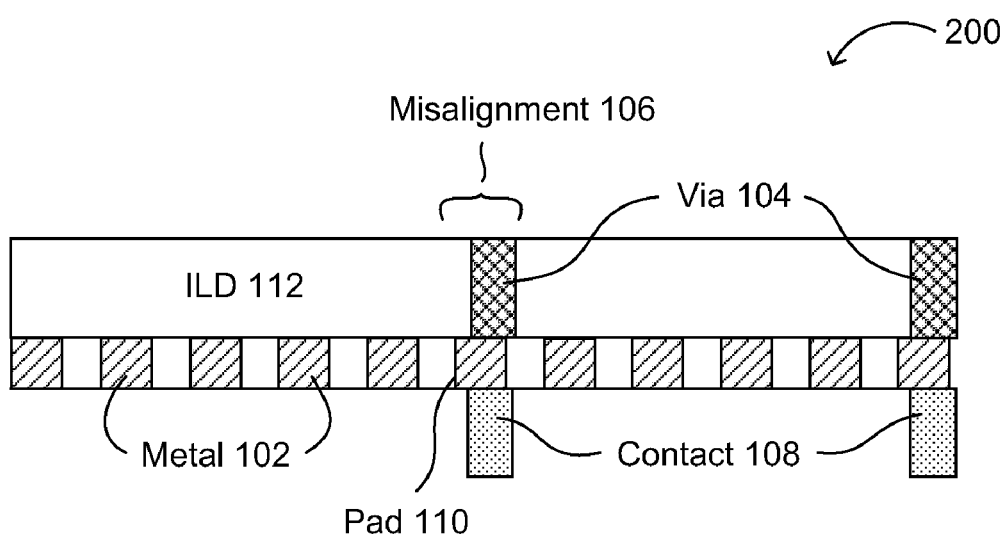
FIG. 2 (conventional)

HIGH DENSITY VIA AND METAL INTERCONNECT STRUCTURES, AND METHODS OF FORMING THE SAME

RELATED APPLICATIONS

This application claims the benefit of U.S. Provisional Application No. 60/895,296, filed on Mar. 16, 2007, incorporated herein by reference in its entirety.

FIELD

The present disclosure generally relates to the field of semiconductor devices. More specifically, embodiments of the present invention pertain to methods and structures for interlayer interconnects within semiconductor devices.

DISCUSSION OF THE BACKGROUND

Manufacturing features of semiconductor devices at a minimum feature size may increasingly be necessary to achieve product competitiveness, which is often dependent on device density and overall chip size in modern semiconductor processing. For sub-100 nm advanced semiconductor processes in particular, contact/via resistance due to misalignment involving metal features of such minimum feature size may be a serious concern. Even with processing techniques that may help improve reliability, such as optical proximity correction (OPC), a final size of the metal features may have relatively large variations due to intrinsic semiconductor processing overlay issues, resulting in misalignment between layers and increased resistance at an interface between contacts/vias and the metal features of such minimum feature size.

FIG. 1 shows a top or layout view 100 of a conventional structure comprising metal features. A metal layer can include a plurality of long metal lines 102 in one area and smaller metal features 110 (e.g., so-called "pads" having a minimum feature size) in another area as shown. When vias 104 are arranged to be connected to such long metal lines 102 and such metal features 110, misalignment 106 can occur between the vias 104 and the metal features 110 as shown.

FIG. 2 shows a cross-sectional view 200 (along dashed line A-A') of the conventional structure of FIG. 1, including interlayer dielectric (ILD) 112 for isolating the metal lines 102 from overlying metal lines (not shown) that connect to metal lines 102 and metal features 110 through vias 104. In FIG. 2, underlying contacts/vias 108 below the metal lines 102 and metal features 110 may also be misaligned relative to the metal lines 102 and metal features 110, consistent with FIG. 1.

SUMMARY

Embodiments pertain to methods, masks, and structures for metal interconnections in semiconductor devices. For example, in one aspect, a method of forming a mask pattern can include searching a layout for a metal feature with a predetermined size limitation and an interconnect layer aligned thereto, removing the metal feature from the layout to form a modified layout, and forming the mask pattern using the modified layout.

The method may search the layout using computer aided design (CAD) methodologies, techniques, and tools (e.g., software and/or a computer or workstation configured to run and/or execute operations according to such software). Also, removing the metal feature can include re-sizing the metal feature, and searching the layout can include searching for a designated layer (e.g., a layer that covers the metal feature) associated with the metal feature. Further, the predetermined size limitation can include a minimum and/or a maximum feature size, in at least one or two dimensions, and the interconnect layer can include an overlying or underlying contact or via layer.

In another aspect, a method of forming an interconnect structure can include forming a first pattern of metal lines, each of the metal lines in the first pattern having a minimum feature size in no more than one dimension in a layout view of the first pattern of metal lines; forming a first dielectric layer on or over the first pattern of metal lines, the dielectric layer having a substantially planar horizontal upper surface; etching a plurality of via holes in the first dielectric layer using a via mask, the plurality of via holes exposing a top surface of the metal lines and a top surface of contacts, vias, or silicon structures below the metal lines; and depositing metal in the via holes. In one embodiment, etching the first dielectric layer exposes the top surface of contacts or vias below the metal lines. The top surface of the contacts or vias may be substantially coplanar with a bottom surface of the first pattern of metal lines.

In various embodiments, the method may further comprise changing an etchant chemistry during the etching step, generally around or after exposing the top surface of the metal lines and prior to exposing the top surface of the contacts, vias, or silicon structures below the metal lines. In such embodiments, the etchant chemistry is generally changed to improve an etch selectivity for the first dielectric layer relative to the metal lines.

In one approach, forming the first pattern of metal lines comprises blanket depositing a metal layer and photolithographically patterning the metal layer to form the first pattern of metal lines. In an alternative approach, forming the first pattern of metal lines comprises blanket depositing a second dielectric layer, photolithographically patterning the second dielectric layer (see FIGS. 3C-1), blanket depositing a metal layer on the patterned second dielectric layer (see FIGS. 3C-2), and planarizing the metal layer to expose the patterned second dielectric layer and form the first pattern of metal lines (see FIGS. 3C-3).

In another aspect, a metal interconnection structure may comprise a first pattern of metal lines, each of the metal lines in the first pattern having a minimum feature size in no more than one dimension in a layout view of the first pattern of metal lines; a first dielectric layer on or over the first pattern of metal lines, the first dielectric layer having a substantially planar horizontal upper surface; a plurality of first metal vias or contacts in the first dielectric layer, the first vias or contacts contacting a top surface of the first pattern of metal lines and a top surface of silicon structures or second vias or contacts below the first pattern of metal lines.

In various embodiments, the metal interconnection structure further comprises the second vias or contacts below the first pattern of metal lines, and the first vias or contacts contact the top surface of the second vias or contacts. Also, the metal interconnection structure may further comprise a premetal dielectric layer below the metal lines, wherein the second vias or contacts are in holes in the premetal dielectric layer. Alternatively or additionally, the first vias or contacts connect to a second pattern of metal lines, in which case the metal interconnection structure may further comprise the second pattern of metal lines. Naturally, the second pattern of metal lines may also have a minimum feature size in no more than one dimension in a layout view of the second pattern of metal lines. The metal interconnection structure may also further comprise a second dielectric layer, on or over the second pattern of metal lines, the second dielectric layer having a substantially planar horizontal upper surface. The second dielectric layer may have a plurality of third metal vias or contacts therein, where the third vias or contacts contact a top surface of the second pattern of metal lines (in part) and a top surface of the first vias or contacts (in part).

In one approach, the first dielectric layer comprises a lower dielectric layer between the metal lines of the first pattern, and an upper dielectric layer on the lower dielectric layer and the first pattern of metal lines. In an alternative approach, the first dielectric layer comprises a continuous insulator material between and over the metal lines of the first pattern.

In various embodiments, CAD procedures can be utilized to remove metal portions having a minimum feature size for via connection. In addition, via formation can include extending an etching deeper than other vias, such as those over larger metal portions in the semiconductor device. Such deeper etched areas can then be filled with metal during a via formation step, thus forming aligned interconnect structures.

The present disclosure advantageously provides methods for forming metal interconnects in a semiconductor device and metal interconnect structures. Such methods and structures can be used to reduce misalignment, thus decreasing contact/via resistance and/or increasing yield. These and other advantages of the present invention will become readily apparent from the detailed description of embodiments below.

BRIEF DESCRIPTION OF THE DRAWINGS

FIG. 1 is a top view or layout diagram showing a conventional structure comprising metal features.

FIG. 2 is a diagram showing a cross-sectional view of the conventional structure comprising metal features of FIG. 1.

FIGS. 3A, 3C-1, 3C-2, 3C-3, and 3E are diagrams showing cross-sectional views of exemplary structures useful for demonstrating the present process of selectively removing metal features with a predetermined size limitation.

DETAILED DESCRIPTION OF THE PREFERRED EMBODIMENTS

Reference will now be made in detail to example embodiments, which are illustrated in the accompanying drawings. While the invention will be described in conjunction with example embodiments, the invention is not intended to be limited to these embodiments. On the contrary, the invention is intended to cover alternatives, modifications and equivalents that may be included within the scope of the invention as defined by the appended claims. Furthermore, in the following detailed description, numerous specific details are set forth in order to provide a thorough understanding of the disclosure, however, the present invention may be practiced without these specific details. In other instances, well-known methods, procedures, components, and circuits have not been described in detail so as not to unnecessarily obscure aspects of the disclosure.

For the sake of convenience and simplicity, the terms "node(s)," "input(s)" and "output(s)" may be used interchangeably, as may the terms "connected to," "coupled with," "coupled to," and "in communication with" (which terms also refer to direct and/or indirect relationships between the connected, coupled and/or communicating elements, unless the context of the term's use unambiguously indicates otherwise). However, these terms are generally given their art-recognized meanings.

Exemplary Structures

Figure 3A:
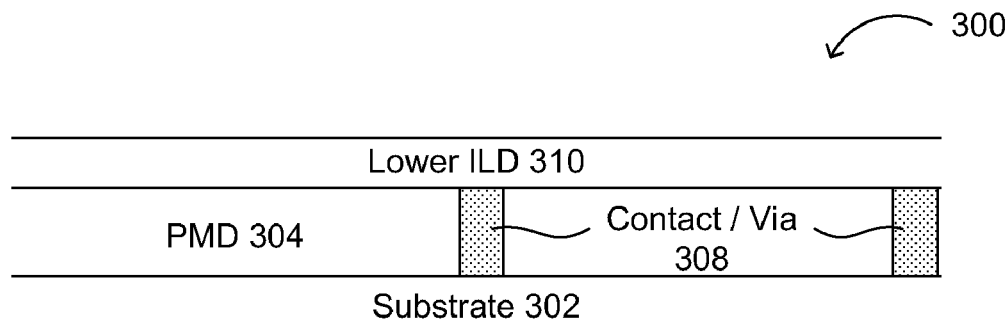

FIG. 3A shows a layout 300 of a substrate 302 with a pre-metal dielectric (PMD) layer 304 thereon, a plurality of metal contacts/vias 308 in and through the PMD layer 304, and a lower interlayer dielectric (ILD) layer 310 thereon, including on the metal contacts/vias 308. Generally, the substrate 302 comprises a single-crystal silicon wafer, which may include one or more epitaxial layers of silicon thereon. In one embodiment, the substrate 302 comprises a plurality of doped regions therein, generally formed by ion implantation through one or more masks. For example, each of the doped regions (not shown) may comprise a heavily-doped n-type or p-type source/drain terminal (e.g., of a CMOS transistor) or a heavily-doped n-type or p-type emitter, collector or base of a bipolar junction transistor (BJT), in contact with one of the contacts/vias 308.

The PMD layer 304 comprises one or more layers of an insulator material, such as silicon nitride, silicon dioxide (e.g., undoped silicate glass [USG], a plasma silane-based oxide, a TEOS-based oxide), and/or a doped silicon oxide (e.g., where the dopant comprises fluorine [e.g., FSG], silicon [to form a so-called silicon-rich oxide] and/or carbon [in which case the dopant may further comprise hydrogen, such as SiOC or SiOCH; so-called "black diamond" insulators], or boron and/or phosphorous [e.g., BSG, PSG, or BPSG]). The contacts/vias 308 may comprise conventional tungsten contacts (which may further comprise one or more liner layers between the tungsten contact and the PMD sidewall, such as titanium and/or titanium nitride), and the lower ILD layer 310 may be selected from among the same materials as the PMD layer 304. For example, each of the PMD layer 304 and the lower ILD layer 310 may include a relatively thin, lowermost silicon nitride layer and a relatively thin, uppermost undoped silicon dioxide layer, but the bulk dielectric may be the same or different (e.g., silicon dioxide doped with boron and/or phosphorous in the PMD layer 304, and a fluorosilicate glass [FSG] in the lower ILD layer 310). Lower ILD layer 310 may be formed by blanket deposition and planarization (e.g., chemical-mechanical polishing), as may PMD layer 304. Contacts/vias 308 may be formed by masking and etching holes in the PMD layer 304, then filling in the holes with one or more metals and/or other conductive materials, and planarizing the metals and/or other conductive materials to remove the deposited material outside of the holes.

Figure 3B:
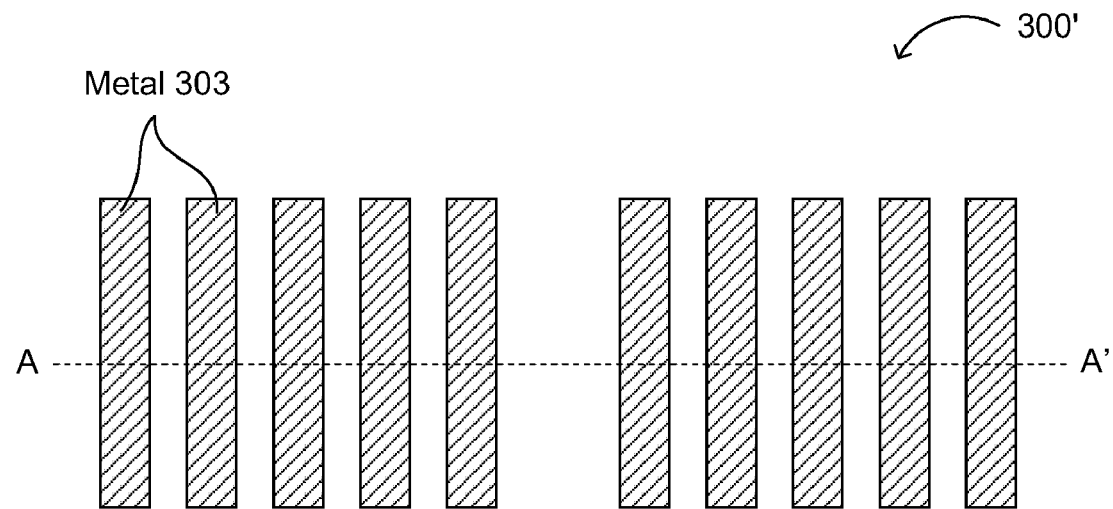
FIGS. 3B and 3D are top views or layout diagrams showing the exemplary structures of FIGS. 3C and 3E.

FIG. 3B shows a layout 300' of an exemplary structure in which metal features of one or more predetermined size limitations have been selectively removed in accordance with one or more techniques discussed below. Thus, only metal features of sizes different from the predetermined size limitations (e.g., metal lines 303) may remain in the metal layer layout 300'. For example, metal features with a length and width (as opposed to a thickness) not greater than a critical dimension plus a predetermined margin (e.g., 30%, 50%, 100% or other value) can be selectively removed as described herein. Alternatively, metal features with a length and a width each less than a predetermined value (which can be different for the length and the width) can be selectively removed. In one embodiment, the exact value of the size limitation(s) for the metal lines or other features to be removed depends upon the minimum feature width and/or spacing, the alignment tolerances of the photolithography equipment, etc. A metal layer mask can then be formed without the metal features of the predetermined size limitations. As a result, metal lines 303, which have a length considerably greater than a corresponding pad (not shown), will be formed in layout 300'. For example, for a metal layer having a critical dimension or minimum feature width of about 70 nm, those features having a width and a length of about 80, 90, 100, or 110 nm can be removed. In this fashion, semiconductor devices, such as high-density memory devices and those that include bipolar junction transistors, etc., can include interconnect structures that have lower contact/via resistance, as compared to those structures that include metal pads 110 (see FIGS. 1-2).

Computer aided design (CAD) methodologies, techniques, and software can be utilized to search a layout for metal features of one or more predetermined size limitations, or of a relatively small size, with a via thereon and/or thereto. These metal features can be filtered out or removed from the metal layer when making the mask for this metal layer. As shown in FIG. 3B, the metal layer mask can be utilized to pattern and form a metal layer without the metal features of the predetermined size limitations (as compared to the layout of the conventional structure shown in FIG. 1 above). Because the remaining metal features may all be substantially of a same size, variations due to intrinsic semiconductor processing overlay errors may be minimized, and misalignments between the metal features relative to contacts/vias formed thereon and underneath may be reduced. Accordingly, filtering out or removing metal features of one or more predetermined size limitations such that many proximate metal features have at least one or two dimensions of substantially similar size may enable lithographic and etching processes to pattern the metal features with tighter pitches, while minimizing overlay errors and misalignments between the metal features and the contacts/vias, thus resulting in lower contact resistance.

Figures 1, 3C:
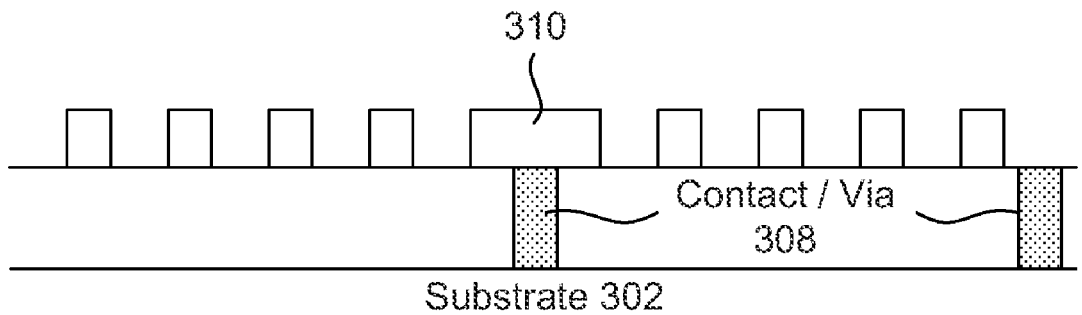
Figures 2, 3C:
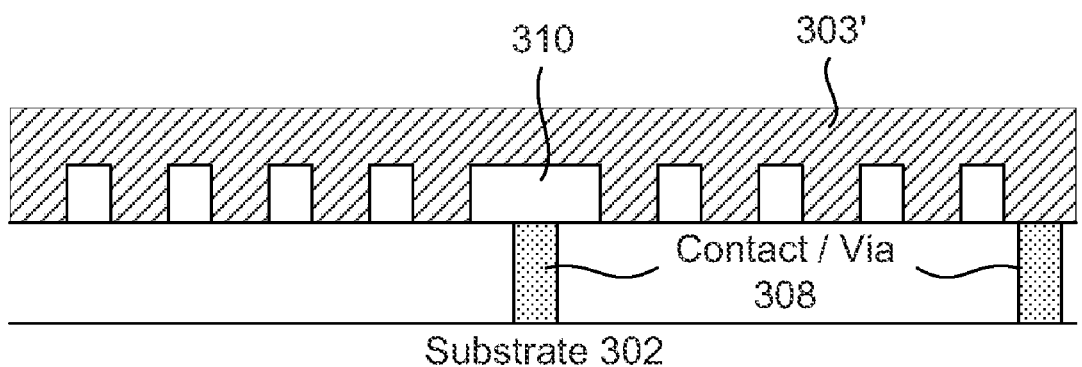
Figures 3, 3C:
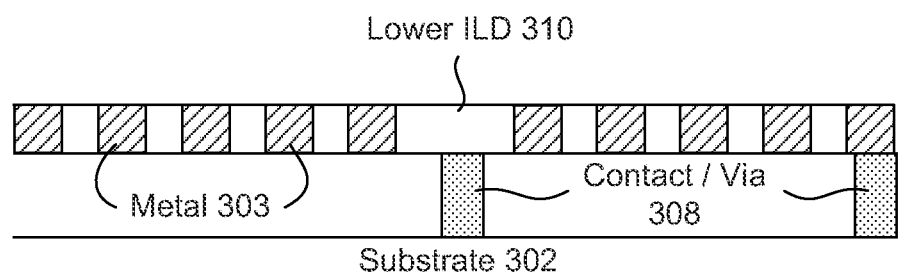

FIGS. 3C-3 shows a cross-sectional view of the exemplary structure of FIG. 3B, having metal features of one or more predetermined size limitations selectively removed, along dashed line A-A'. Contacts/vias 308 are shown with a lower interlayer dielectric (ILD) 310 thereon, and metal features 303 in the lower ILD 310. In specific embodiments, certain metal features may be identified, filtered, and/or removed from the metal layer pattern mask used to pattern the ILD and form the metal features. Then, metal corresponding to the portion of the metal layer with the removed metal features (e.g., the "pads" 110 in FIG. 1) is subsequently replaced by a contact or via in a via layer formed thereon. Thus, the portion of the metal layer with metal features of the predetermined size limitations that have a via thereon can be removed from the layout. In the example of FIGS. 3C-3, the metal lines 303 may comprise copper, which may have a relatively thin adhesive layer (e.g., comprising tantalum) adjacent to the sidewall of the lower ILD layer 310 and/or a relatively thin barrier later (e.g., tantalum nitride) between the bulk copper and the lower ILD layer 310.

CAD methodologies, techniques, and software can be utilized to filter out or remove the metal features of one or more predetermined size limitations prior to mask making For example, such metal feature removal can occur after performing a layout versus schematic (LVS) check for circuit connectivity. The CAD removal process can include a sizing down, and sizing up for removal of a metal portion. For example, when the predetermined size limitation for filtering is a critical dimension or minimum feature size, those features with a length slightly greater than the critical dimension or minimum feature size can be removed by shrinking the sizes of all metal features by a certain amount (e.g., 10%, 20% or other appropriate value) and removing those features that fall below the threshold. After filtering (or selective removal), the remaining features can be resized to their original dimensions ("sizing up"). Other approaches can include using a separate layer (e.g., a metadata layer, a metal option layer, or a separately defined covering layer) to designate the metal portions to be removed. For example, the metadata layer could be ignored for LVS purposes.

Figure 3D:
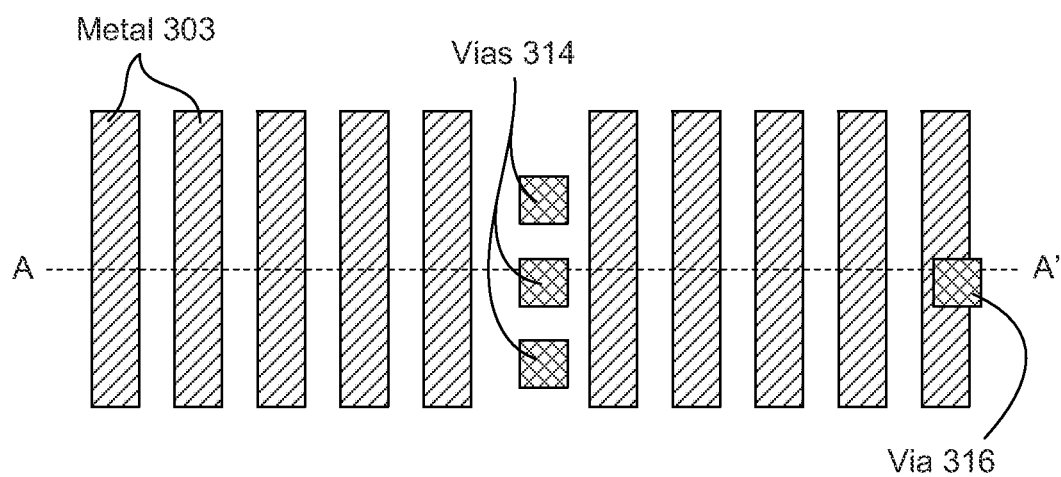

FIG. 3D shows a top view or layout of an exemplary interconnect structure in accordance with embodiments. Relatively long metal lines 303 of the metal layer and vias 316 are generally as discussed above. However, embodiments include vias 314 as a unitary structure.

Figure 3E:
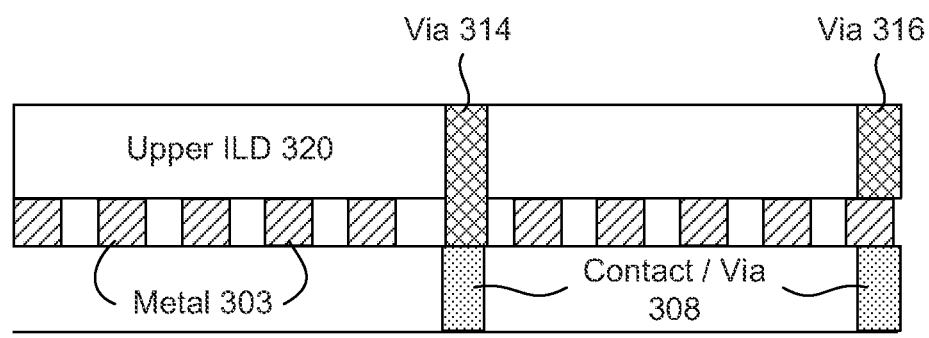

FIG. 3E shows a cross-sectional view of the interconnect structure of FIG. 3D along dashed line A-A', which further includes an upper ILD 320. The upper ILD 320 can be formed in the same way and using the same material(s) as lower ILD 310. Contacts/vias 314 can connect to via 308 in the area where metal features having a size within the predetermined size (or dimension filter) have been removed, and can pass through both upper ILD 320 and lower ILD 310. As shown, the via 314 in the region where the metal "pads" have been removed can have a greater depth or height than the via 316 to a metal line 303. In fact, if the etch selectivity is sufficiently high and the slope of the holes for contacts/vias 314 is sufficiently close to vertical (e.g., 90°), one could even remove contacts/vias 308 between the substrate and the contacts/vias 314, to avoid a further potential incidence of misalignment.

Thus, a minimum-feature-sized portion removed from a metal layer in a mask can essentially be replaced with part of a via interconnect structure in a processed semiconductor device. To create this, etching can occur deeper into the dielectric between lines in the metal layer, resulting in a deeper via structure. This is in contrast to conventional via structures, where typically all vias in a given metal layer have the same size and depth. Specific embodiments can include any suitable etching process (e.g., multi-step etching, differential etching, etc.), and may use a photolithography step with a photoresist or hard mask (or photoresist plus a hard mask) to pattern the vias. However, based on a timed etch or on detection of a metal surface, one may change the etch chemistry at or around the time that the upper ILD layer has been etched through to increase the etch selectivity for the dielectric materials relative to the metal of the metal lines 303. The hard mask may comprise, for example, silicon nitride or even a metal (the latter of which should be removed prior to further processing).

Figure 4A:
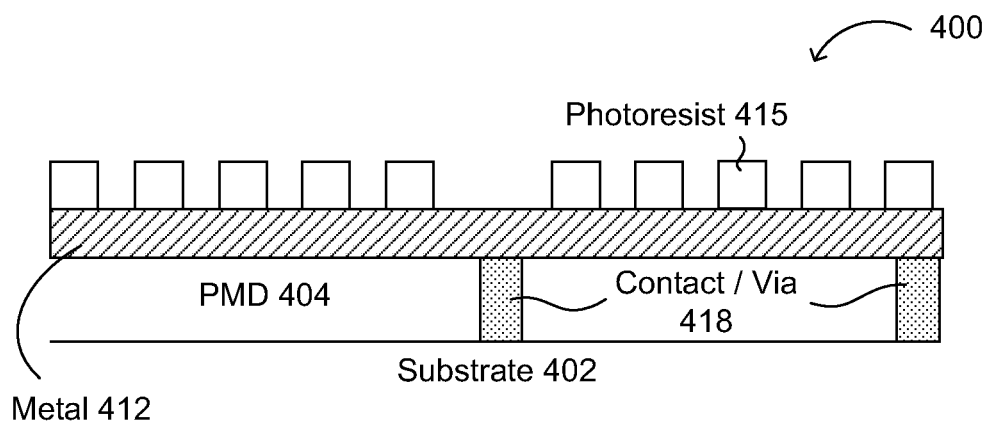
FIGS. 4A-4C and 4E are diagrams showing cross-sectional views of exemplary interconnect structures for demonstrating an alternative process of selectively removing metal features with a predetermined size limitation

FIGS. 4A-4E show cross-sectional views of exemplary interconnect structures made in accordance with alternative embodiments. FIG. 4A shows a cross-sectional view 400 of a substrate 402 having a first metallization layer 412 deposited on a PMD layer 404 having contacts/vias 418 therein. The substrate 402, the PMD layer 404 and the contacts/vias 418 comprise materials and are made as described for substrate 302, PMD layer 304 and contacts/vias 308 in FIG. 3A. In the embodiment of FIG. 4A, the first metallization layer 412 may comprise a layer of aluminum of aluminum alloy (e.g., Al metal with up to 4 wt. % of Cu, up to 2 wt. % of Ti, and/or up to 1 wt. % of Si), with one or more layers above and/or below the bulk metal layer (e.g., an adhesive layer comprising, e.g., Ti on the PMD layer 404 and/or on the upper surface of the bulk Al layer, a barrier layer comprising, e.g., TiN between the PMD layer 404 and the bulk Al layer [e.g., on the Ti adhesive layer], and/or an anti-reflective and/or hillock suppression layer comprising, e.g., TiN or TiW above the bulk Al layer). A layer of photoresist 415 is deposited on the first metallization layer 412 and patterned by photolithography, using a modified mask having metal features of one or more predetermined size limitations selectively removed therefrom.

Figure 4B:
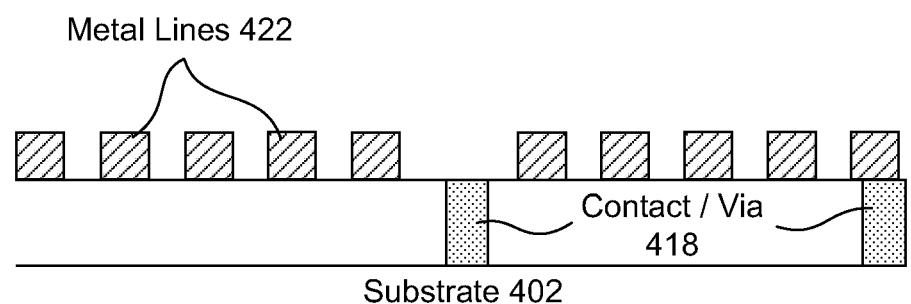

FIG. 4B shows a cross-sectional view of the first metallization layer 412 etched using the patterned photoresist 415 as a mask to form metal lines 422. Alternatively, the metal lines 422 can be formed using a damascene process, or other conventional process. Conditions and etchants for etching metallization in such a manner are well known in the art, although one should ensure reasonable etch selectivity for the metal of the first metallization layer 412 relative to the material(s) of the contacts/vias 418.

Figure 4C:
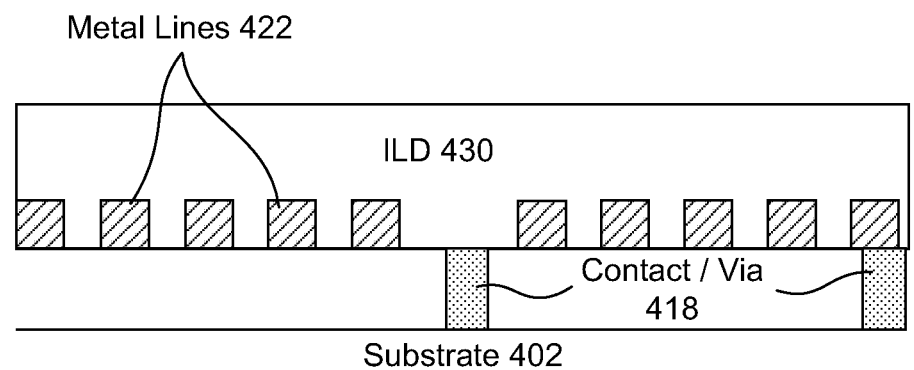

FIG. 4C shows a cross-sectional view of the etched first metallization layer having an ILD layer 430 deposited thereon. The ILD layer 430 can comprise the same materials and be formed in the same manner as upper ILD layer 320 in FIG. 3E, but the ILD layer 430 may, in certain embodiments, employ a conventional "gap-fill" oxide, such as a high density plasma-assisted silane-based oxide or silicon-rich oxide, as a lower sublayer (e.g., on a lowermost silicon nitride etch stop layer, but before a bulk "low k" dielectric such as FSG or SiOC) in order to fill the spaces between metal lines 422 (see FIG. 4C) without significant formation of voids.

Figure 4D:
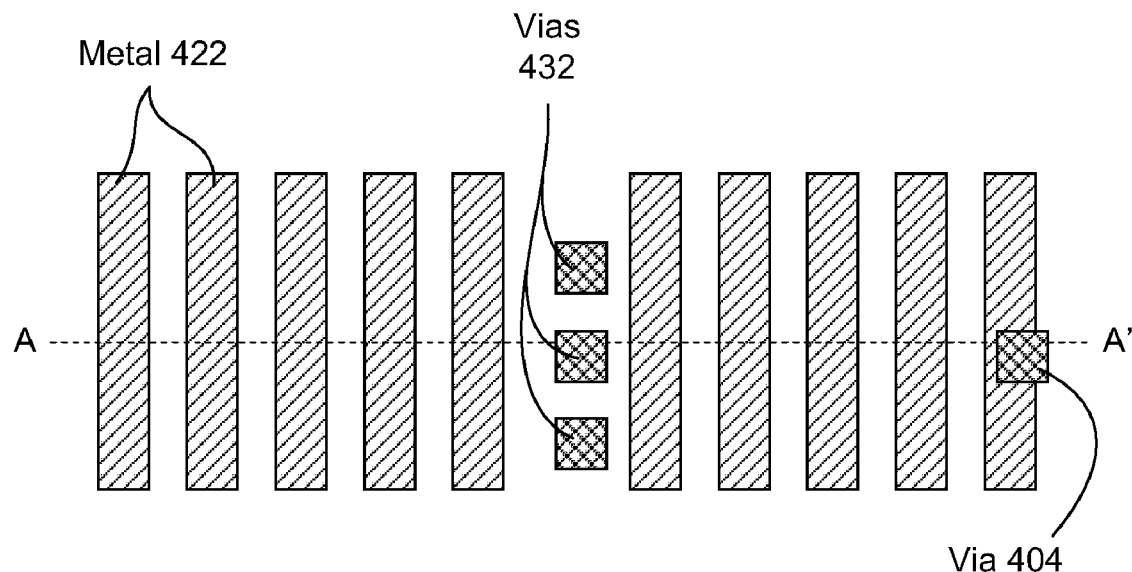
FIG. 4D is a top view or layout diagram showing the exemplary interconnect structure in accordance with FIG. 4E.
Figure 4E:
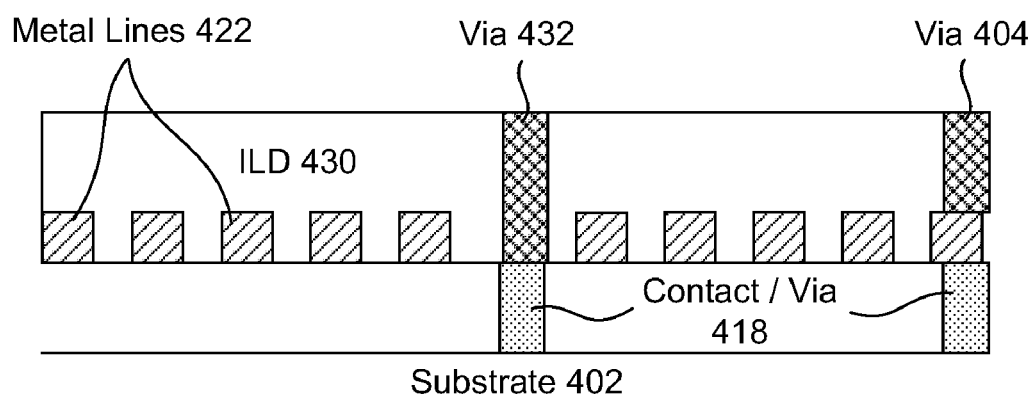

FIG. 4D shows a top view or layout of an exemplary interconnect structure in accordance with the embodiment(s) described with regard to FIGS. 4A-4C. FIG. 4E shows a cross-sectional view of the interconnect structure of FIG. 4D along dashed line A-A'. Contacts/vias 432 pass through the entire thickness of ILD 430 and can connect to via 418 in one area. Via 404 connects to a metal line 422 in another area. As shown, the via portion 432 in the region of the metal layer from which metal features having predetermined size limitation(s) are removed can have a greater depth or height then the other via 404. Vias 404 and 432 can comprise materials and be made as discussed above for vias 314 and 316 in FIG. 3E, although in one embodiment where the ILD 430 comprises a lowermost silicon nitride layer (see FIG. 4E), it may not be necessary or advantageous to change etchant chemistry until the silicon nitride layer is exposed in the holes for both vias 404 and 432.

Figure 5A:
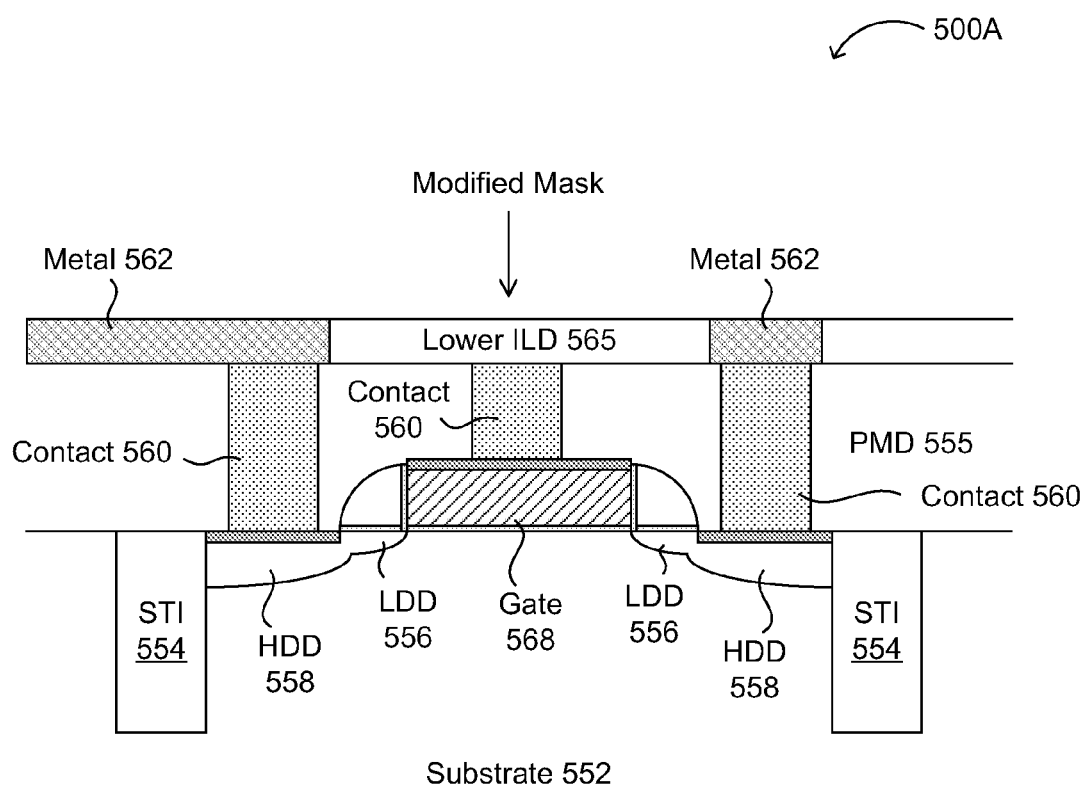
FIGS. 5A-5B are cross-sectional views showing an exemplary modified mask effect on an interconnect structure and an exemplary interconnect structure made using the modified mask.

FIG. 5A shows a cross-sectional view 500A of an exemplary modified mask effect on an interconnect structure for a CMOS transistor. Shallow trench isolation (STI) regions 554 can surround and/or isolate a transistor active area in substrate 552. Highly doped drain (HDD) regions 558 and lightly doped drain (LDD) regions 556 can form source and drain doping profiles for the CMOS transistor. The gate 568 may comprise polysilicon and/or a metal silicide, and is generally formed on a thin dielectric layer (e.g., thermally grown silicon dioxide and/or a high k dielectric material, such as hafnium oxide or silicon nitride [which can also function as a charge trapping layer or "floating gate" for a nonvolatile memory device]). Contacts 560 can be formed on the source and drain diffusion regions 558, as well as on gate 568, as shown. A salicide (self-aligned metal silicide) layer may be formed on the source and drain diffusion regions 558 and the gate 568 in accordance with known techniques. Also, a modified mask from which have been removed certain metal features with predetermined size limitation(s) (e.g., above center contact 560) can be used for forming the metal lines 562.

A premetal dielectric (PMD) layer 555 can be formed over the source and drain diffusion regions 558, as well as STI regions 554 and the gate 568, by chemical vapor deposition (CVD). The PMD 555 can be etched to expose surfaces of the gate 568 and the source and drain regions 558 to form contact holes. Conductive films can be deposited to fill the contact holes to form contacts 560 to the source and drain regions 558. The conductive films may comprise a bulk layer of aluminum, copper, tungsten, or an alloy thereof. An adhesion layer and/or a diffusion barrier layer may be formed along the surfaces of the contact holes (as described elsewhere herein) before the contact holes are filled with the conductive films. In the embodiment shown in FIG. 5A, the center contact 560 to the gate 568 may be omitted. A lower interlayer dielectric (ILD) 565 can comprise materials and be formed in the same manner as lower ILD layer 310 in FIG. 3A, and metal lines 562 (FIG. 5A) can comprise materials and be formed in the same manner as metal lines 303 in FIG. 3C.

Figure 5B:
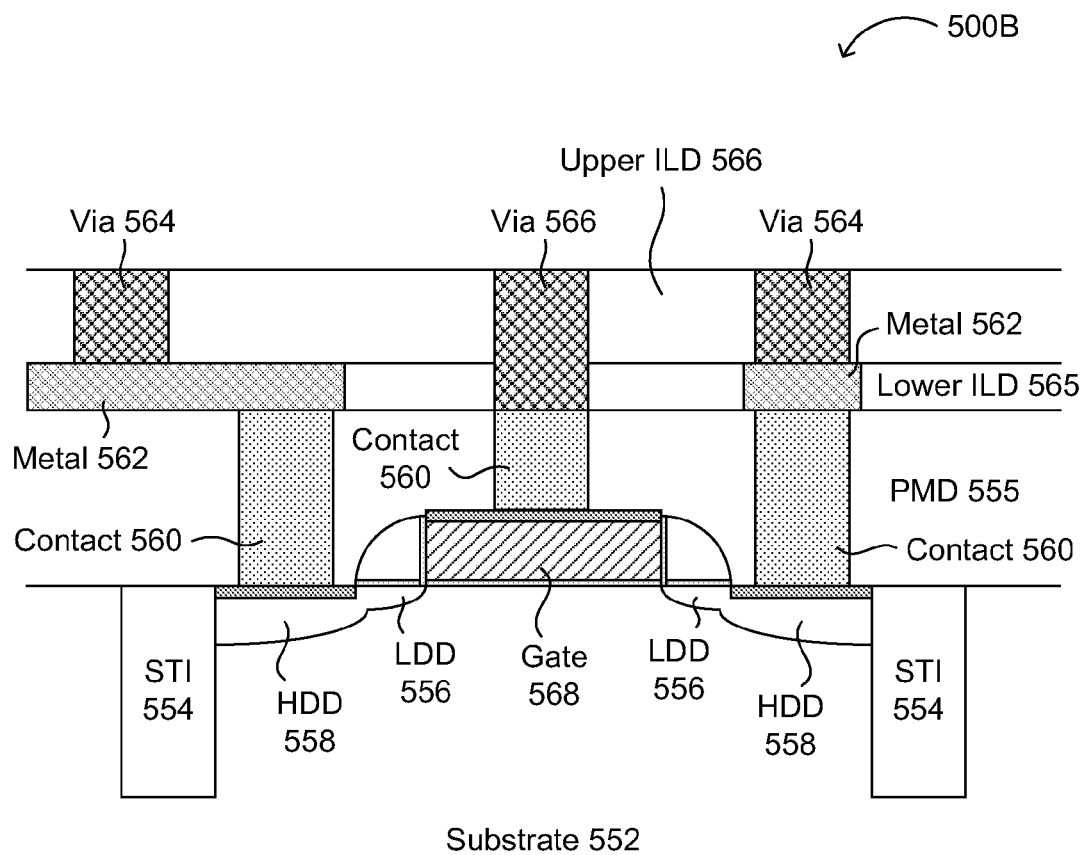

FIG. 5B shows a cross-sectional view 500B of the exemplary interconnect structure of FIG. 5A, in which contacts from conductive structures under an upper interlayer dielectric (ILD) 566 to overlying conductive structures are formed. Upper ILD layer 566 can be formed, e.g., by chemical vapor deposition (CVD) over the semiconductor device of FIG. 5A. Upper ILD layer 566 can be formed in the same manner and comprise the same materials as upper ILD 320 of FIG. 3E. Thus, upper ILD 566 (FIG. 5B) may include one or more layers of silicon dioxide (e.g., undoped silicate glass (USG), plasma silane- or tetraethyl orthosilicate (TEOS)-based glass, etc.), doped silicon dioxide (e.g., fluoro-silicate glass (FSG), borosilicate glass (BSG), phosphosilicate glass (PSG), borophosphosilicate glass (BPSG), etc.) and/or silicon nitride.

ILD layers 565 and 566 can be etched to expose surfaces of metal lines 562 and (where such metal lines are absent) contacts 560. Where such contacts 560 are absent (e.g., the center contact 560 to the gate 568 in one alternative embodiment), the PMD layer 555 can be further etched gate, source, and drain regions to form contact holes. Conductive films can be deposited as described herein to fill the contact holes to form vias 564 to metal lines 562 and vias 566 to contacts 560 (or, in the absence of such contacts, to gates 568 and/or to source/drain regions 558). As shown, vias 566 are formed in regions of ILD layer 565 without small metal features (due to use of the modified metal mask, as discussed above), and have a greater depth and/or height than the vias 564 that connect to metal 562.

Exemplary Methods

Figure 6:
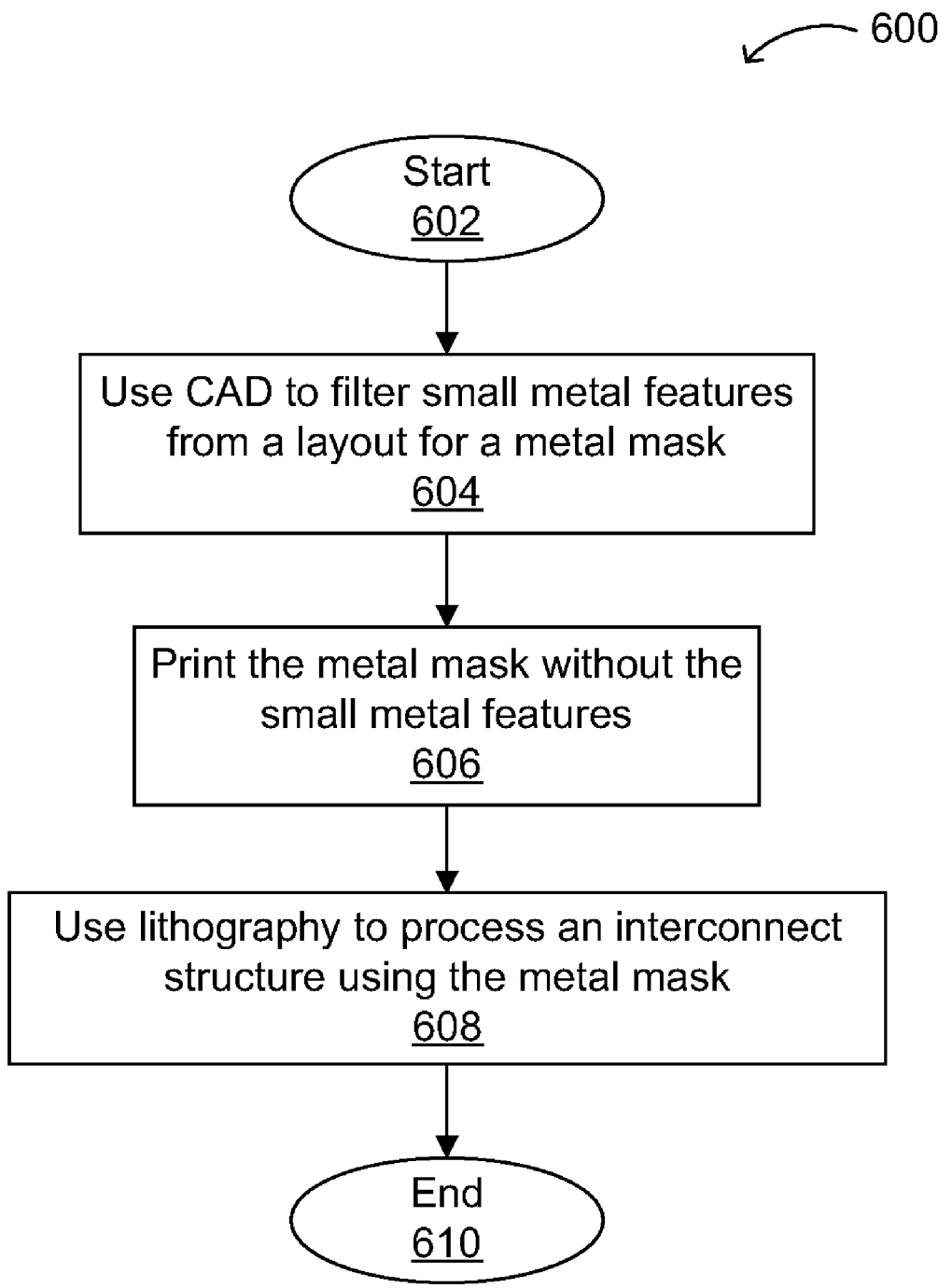
FIG. 6 is a simplified flow diagram showing an exemplary method of forming an interconnect structure.

FIG. 6 shows a flow diagram of an exemplary method 600 of forming an interconnect structure in accordance with various embodiments. The flow begins (602), and a CAD tool can be used to filter small metal features from a layout for a metal mask (604). For example, the CAD tool (software) can be used to search a layout (e.g., for a layer of metallization) and identify those features therein having one or more predetermined size limitations and a connection to another contact, via., or metal line, as discussed herein. For example, as discussed above, various CAD methods can be used to remove the small metal features, such as re-sizing, including and/or searching metadata or other identification layers, etc.

The metal mask can then be made without the small metal features removed therefrom (606). Lithography can be used to process an interconnect structure using the modified metal mask (608), and the flow completes (610). Thus, the modified mask pattern can be used in processing and/or defining the interconnect structures, while the original mask pattern can be used for LVS, other circuit connectivity checks, and/or simulations.

Figure 7:
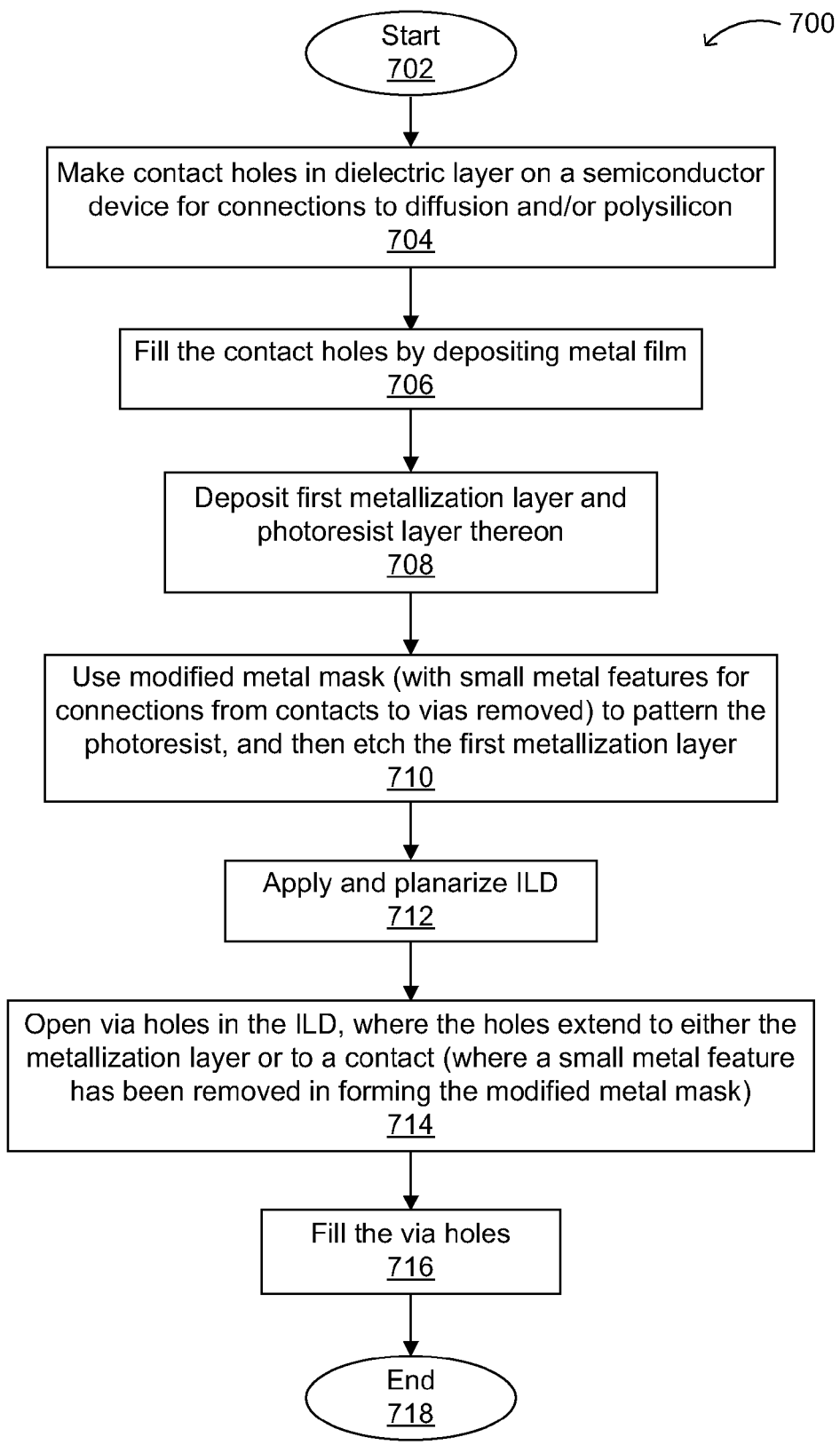
FIG. 7 is a more detailed flow diagram showing an exemplary method of forming an interconnect structure.

FIG. 7 shows a more detailed flow diagram of an exemplary method 700 of forming an interconnect structure in accordance with various embodiments. The flow begins 702 and contact holes can be formed in a dielectric layer (e.g., a PMD layer) on a semiconductor device for connections to diffusion and polysilicon (704). The contact holes can be filled with a metal film (706). A first metallization layer can then be deposited, followed by a photoresist layer on the metallization layer (708). A modified mask (e.g., with small metal features for connections from underlying contacts to overlying vias removed) can then be used to pattern the photoresist, and the exposed metallization layer can be etched to form a metallization pattern corresponding to the modified mask (710). An ILD layer can then be deposited and planarized (712). Via holes can then be opened in the ILD, where the holes extend to either the metallization layer or to a contact where a small metal feature has been removed in forming the modified metal mask (714). The via holes can be filled (716), thereby completing the flow 718.

Figure 8:
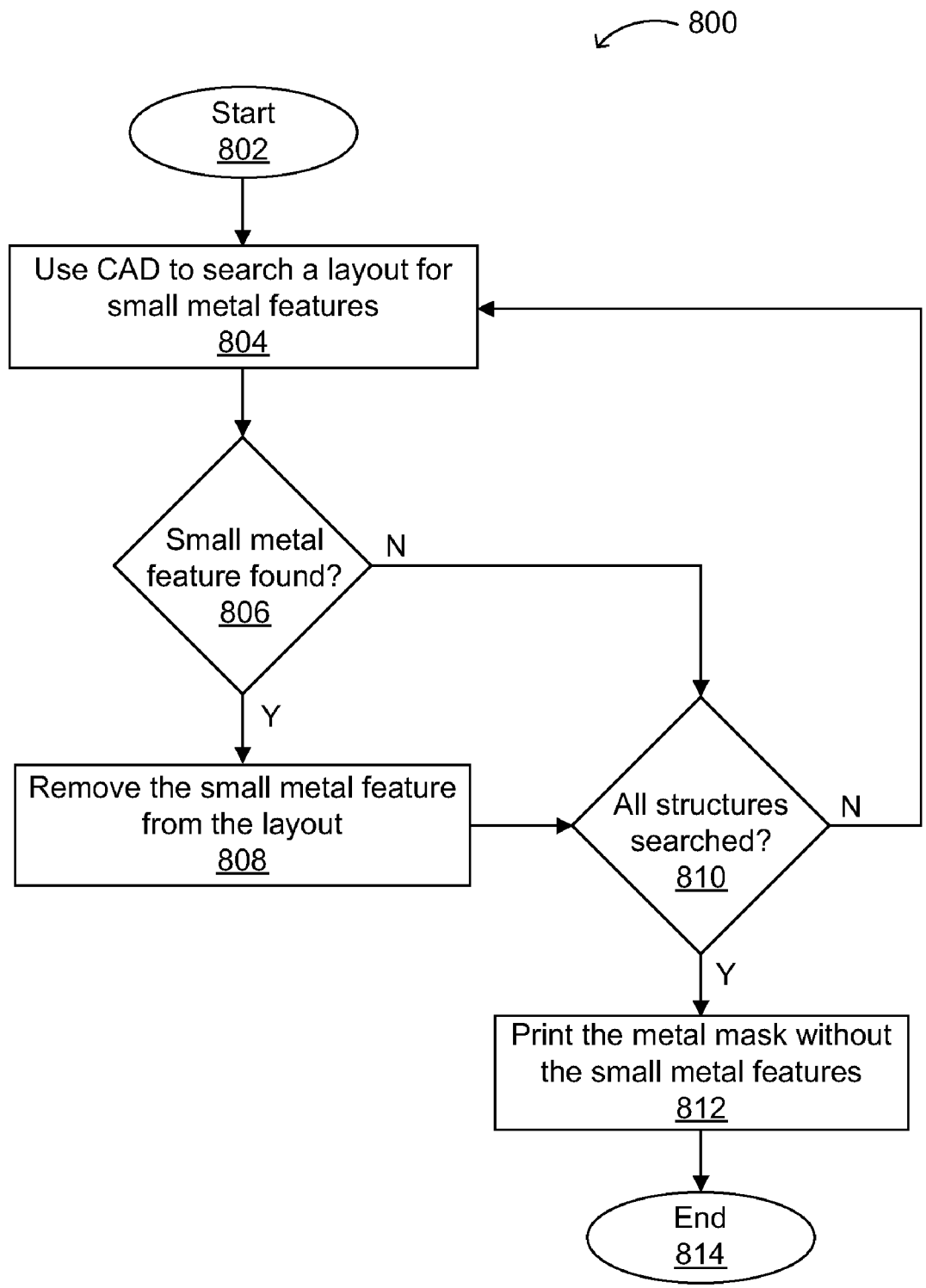
FIG. 8 is a flow diagram showing an exemplary method of forming a metal mask for an interconnect structure.

FIG. 8 shows a flow diagram of an exemplary method 800 of forming a metal mask for an interconnect structure in accordance with various embodiments. The flow begins (802), and a CAD tool can be used to search a layout for small metal features (804). For example, techniques described above with regard to FIGS. 3B, 3C and/or 6 can be employed. If such a metal feature is found (806), the metal feature can be removed from the layout (808). Once the metal feature has been removed (808), or if a metal feature is not found (806), when regions of the layout containing metal structures remain to be searched (810), the CAD tool can be used to continue searching (804). However, if all the structures have been searched (810), the metal mask can be made without the small metal features (812), and the flow completes (814). In this fashion, a modified layout can be formed that is devoid of minimum metal features/islands having an interconnect layer (e.g., a via) aligned (or misaligned) thereto.

Figure 9:
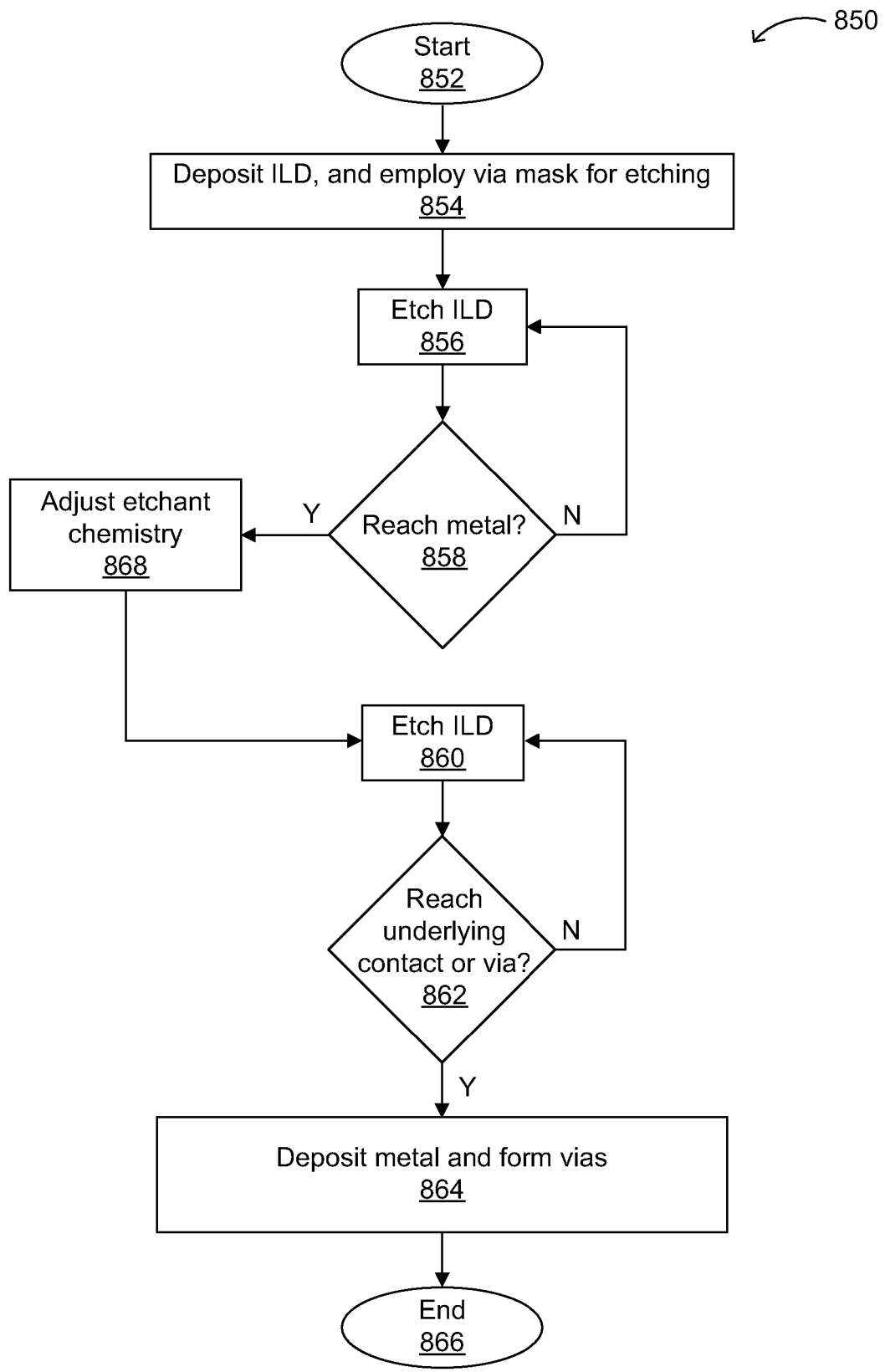
FIG. 9 is a flow diagram showing an exemplary method of processing an interconnect structure.

FIG. 9 shows a flow diagram of an exemplary method 850 of processing an interconnect structure in accordance with alternative embodiments, particularly with regard to the process flow diagrammed in FIGS. 3A-3E and FIGS. 4A-4E. The flow begins (852), an ILD can be deposited, and a via mask employed for etching the ILD (854). Using the via mask, the ILD can be etched (856). This etching step can continue until a top portion of a metal layer is reached (858), thereby forming a first interconnect opening portion and/or a first subset of contact/via holes to metal lines. At this point, the etchant may be adjusted or changed (868) in order to improve the etch selectivity for the ILD versus the metal. Etching the ILD using the via mask can then continue (860) until underlying contacts and/or vias are reached (862), thereby forming a second interconnect opening portion and/or a second subset of contact/via holes to underlying contacts/vias (or other structures if the underlying contacts/vias are absent). Metal can then be deposited to form the upper level contacts/vias (e.g., in the first and second interconnect opening portions and/or the first and second subsets of contact/via holes) (864), and the flow completes (866).

CONCLUSION/SUMMARY

Thus, the present disclosure provides methods for making metal interconnects in semiconductor devices and metal interconnect structures. In particular, embodiments provide an interconnect structure for minimum feature sized metal structures having reduced contact resistance.

The foregoing descriptions of specific embodiments have been presented for purposes of illustration and description. The embodiments are not intended to be exhaustive or to limit the invention to the precise forms disclosed, and many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A method of forming an interconnect structure, the method comprising:
    defining a first metal pattern having a minimum feature size in a layout view;
    removing, from the first metal pattern, metal features having the minimum feature size in more than one dimension;
    forming a first pattern of metal lines according to the first metal pattern with the metal features having the minimum feature size in more than one dimension removed, each of the metal lines having the minimum feature size in no more than one dimension;
    forming a first dielectric layer on or over the first pattern of metal lines, the dielectric layer having a substantially planar horizontal upper surface;
    etching a plurality of via holes in the first dielectric layer using a via mask, the plurality of via holes exposing a top surface of the metal lines;
    changing an etchant chemistry after exposing the top surface of the metal lines, and continuing to etch the plurality of via holes using the changed etchant chemistry to expose a top surface of contacts, vias, or silicon structures below the metal lines in one or more areas where the metal features having the minimum feature size in more than one dimension have been removed; and
    depositing metal in the via holes.

2. The method of claim 1, wherein the etchant chemistry is changed to change an etch selectivity for the first dielectric layer relative to the metal lines.

3. The method of claim 1, wherein etching the first dielectric layer exposes the top surface of contacts or vias below the metal lines.

4. The method of claim 3, wherein the top surface of the contacts or vias is substantially coplanar with a bottom surface of the first pattern of metal lines.

5. The method of claim 1, wherein forming the first pattern of metal lines comprises blanket depositing a metal layer and photolithographically patterning the metal layer to form the first pattern of metal lines.

6. The method of claim 1, wherein forming the first pattern of metal lines comprises blanket depositing a second dielectric layer, photolithographically patterning the second dielectric layer, blanket depositing a metal layer on the patterned second dielectric layer, and planarizing the metal layer to expose the patterned second dielectric layer and form the first pattern of metal lines.

7. The method of claim 1, wherein the via holes connecting a top surface of contacts, vias, or silicon structures below the metal lines have a depth greater than that of the via holes that expose the top surface of the metal lines by a thickness of the metal lines.

8. The method of claim 1, wherein removing the metal features from the first metal pattern comprises searching the first metal pattern for the metal features having the minimum feature size in more than one dimension.

9. The method of claim 8, wherein the first metal pattern is searched using a computer aided design (CAD) tool.

10. The method of claim 1, wherein removing the metal features comprises re-sizing the metal features.

11. The method of claim 8, wherein searching the first metal pattern comprises searching a designated layer associated with the metal features.

12. The method of claim 1, wherein the minimum feature size is a predetermined length in a first dimension and a predetermined width in a second dimension.

13. The method of claim 12, wherein metal features having a length less than or equal to the predetermined length and a width less than or equal to the predetermined width are selectively removed.

14. The method of claim 5, wherein the metal layer comprises a bulk layer of aluminum or an aluminum alloy, an adhesive layer and/or a barrier layer below the bulk layer, and an anti-reflective and/or hillock suppression layer above the bulk layer.

15. The method of claim 14, wherein the bulk layer comprises Al metal with up to 4 wt. % of Cu, up to 2 wt. % of Ti, and/or up to 1 wt. % of Si.

16. The method of claim 15, wherein the metal layer comprises the adhesive layer and the barrier layer, the barrier layer being on the adhesive layer.

17. The method of claim 16, wherein the adhesive layer comprises Ti, and the barrier layer comprises TiN.

18. The method of claim 15, wherein the anti-reflective and/or hillock suppression layer comprises TiN or TiW.

19. The method of claim 6, wherein the metal layer comprises copper.

20. The method of claim 14, wherein the metal layer further comprises an adhesive layer and a barrier layer between the copper and the second dielectric layer.

21. The method of claim 14, wherein the adhesive layer comprises tantalum and the barrier layer comprises tantalum nitride.

* * * * *